(12) United States Patent
Brown

(10) Patent No.: US 6,246,224 B1
(45) Date of Patent: Jun. 12, 2001

(54) APPARATUS FOR DETECTING PRESENCE OF PIEZOELECTRIC MATERIAL

(75) Inventor: Richard Hunter Brown, Dreieich-Offenthal (DE)

(73) Assignee: Measurement Specialties Inc., Fairfield, NJ (US)

( * ) Notice: Subject to any disclaimer, the term of this patent is extended or adjusted under 35 U.S.C. 154(b) by 0 days.

(21) Appl. No.: 09/011,049

(22) PCT Filed: Aug. 8, 1996

(86) PCT No.: PCT/IB96/00782

§ 371 Date: Feb. 14, 1998

§ 102(e) Date: Feb. 14, 1998

(87) PCT Pub. No.: WO97/07478

PCT Pub. Date: Feb. 27, 1997

(30) Foreign Application Priority Data

Aug. 14, 1995 (DE) .................................................. 9516503

(51) Int. Cl.[7] .............................. G01R 29/22; G01R 29/12
(52) U.S. Cl. ............................................. 324/109; 324/458
(58) Field of Search ............................... 324/109, 117 R, 324/458; 194/206

(56) References Cited

U.S. PATENT DOCUMENTS

| 4,528,502 | * | 7/1985 | Rocha | 324/109 |
| 4,792,667 | | 12/1988 | Chen | 235/488 |

FOREIGN PATENT DOCUMENTS

| 0 166 273-A2 | 1/1986 | (EP) | G06K/19/08 |
| WO 94/20932 | 9/1994 | (WO) | G07D/7/00 |

* cited by examiner

*Primary Examiner*—Safet Metjahic
*Assistant Examiner*—J. Kerveros
(74) *Attorney, Agent, or Firm*—Duane, Morris & Heckscher

(57) ABSTRACT

An apparatus (2) comprising one substantially transparent electrode (12), a second shielded electrode (10) where the document (26) is to be placed between the first and second electrodes (12, 10), an optical device (18) capable of generating a rapid optical pulse that would be incident upon the document and an electrical impulse detection device connected to the second electrode (10) for detecting charge given off by the piezoelectric material in response to the optical pulse.

18 Claims, 4 Drawing Sheets

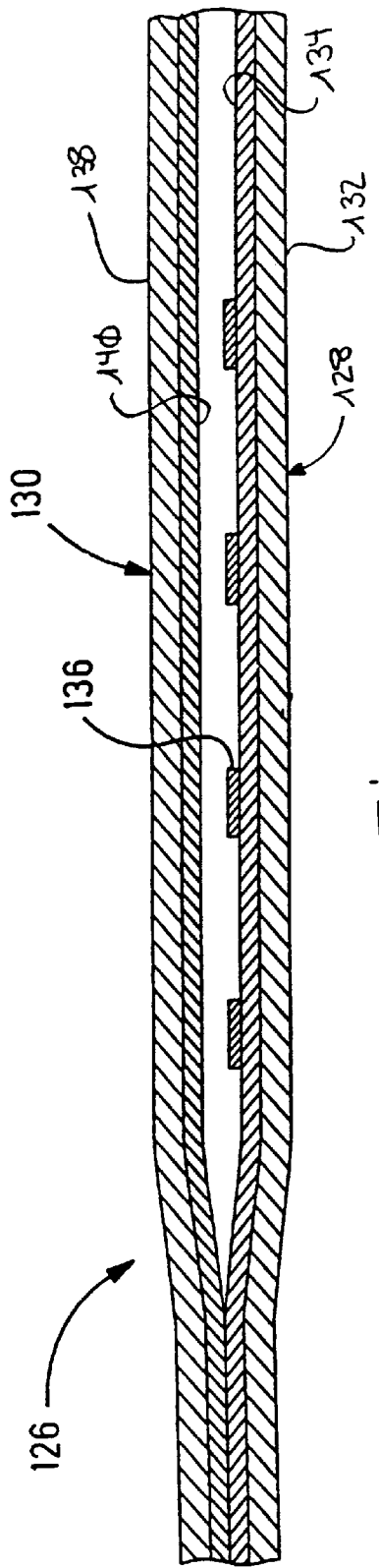
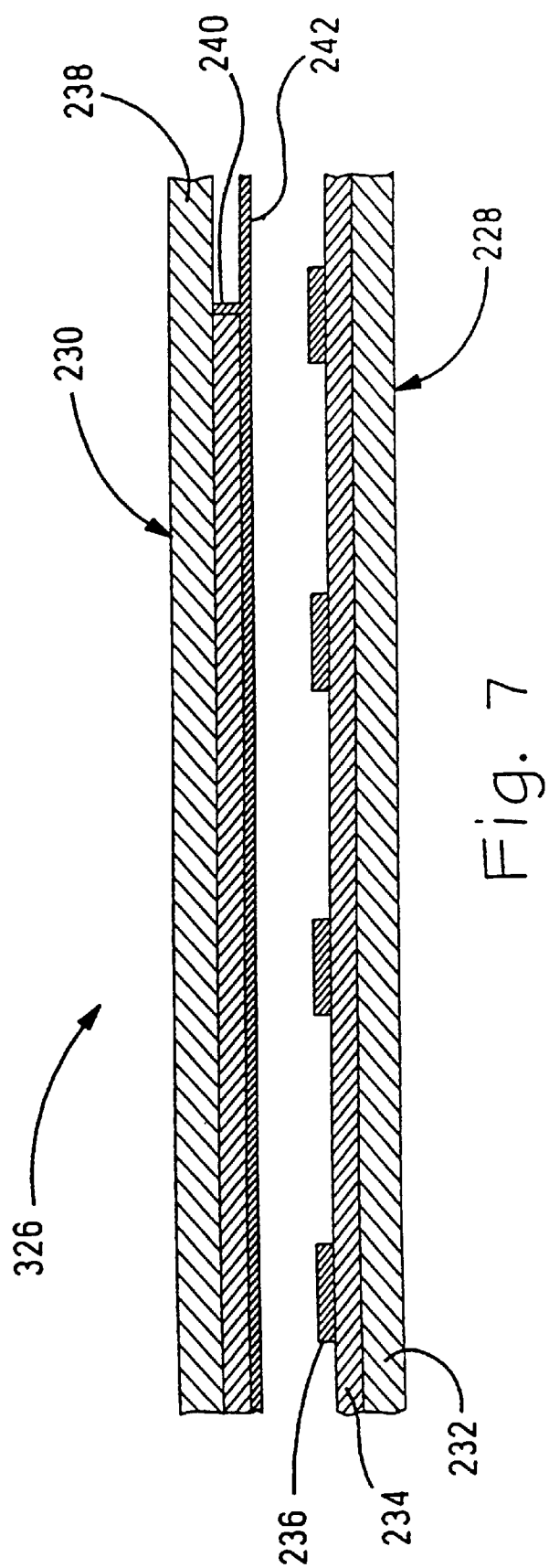

APPARATUS FOR DETECTING PRESENCE OF PIEZOELECTRIC MATERIAL

BACKGROUND OF THE INVENTION

1. Field of the Invention

The present invention relates to an apparatus for determining the authenticity of documents containing piezo electric materials.

2. Summary of the Prior Art

It is known by way of U.S. Pat. No. 4,792,667 to take advantage of the pyroelectric and piezoelectric characteristics of polarized polymers in order to determine whether an authentic and un-altered document has been presented. A polymeric material formed as a pre-poled film may be affixed to the surface of a document by an adhesive or may be applied as a coating to the surface of the document. If not pre-poled, the polymeric material may be polarized after being placed on the document. A testing apparatus is also disclosed therein that physically stimulates the polymeric material and detects a level of current flow that is indicative of polarized material.

The devices disclosed, use either a heating element to effect a temperature change in the material or a device to impart a physical impact thereupon, whereby as a result of each stimulus a current is generated that may be detected in order to determine whether the piezo-electric structure is intact. A problem with the afore going is that the testing is relatively slow in nature with respect to the thermal excitation and a complicated mechanical device is required where the mechanical actuation is used, thereby making these known structures impractical for the high volumes necessary to verify documents. Another problem is that the output from the piezoelectric material that these devices choose to measure is current, which is the rate of change of charge being given off by the material as it is changing in response to a particular input. This is a problem as piezo film typically offers very high voltage sensitivity, but relatively poor charge sensitivity, whereby the current output is low. Apparent from the mentioned disclosure, is that the heat transport occurs by conduction or convection. In both cases the rate of change in temperature seen by the piezoelectric material will be relatively low and the resulting mechanical expansion which produces the net current output will be slow so that the output is low as indicated by reference to utilization of a picroampeter, thereby providing a difficult to measure response that as a result of the construction of the sample and associated variations therein will also vary.

SUMMARY OF THE INVENTION

It is an object of this invention to provide an apparatus for determining the authenticity of a document containing a piezo polymer material where the integrity and presence of the piezo polymer material is to be determined. It is another object of this invention that this testing occur in a rapid and simple manner. It is yet another object of this invention that the apparatus to perform the testing uses external electrodes that do not adversely affect the document. It is still another object of this invention to provide a testing device that utilizes a rapid optical pulse to which the document is subjected in order to determine the integrity or presence of piezo polymer material.

These objects are accomplished by providing an apparatus comprising one substantially transparent electrode, a second shielded electrode where the document is to be placed between the first and second electrodes, an optical device capable of generating a rapid optical pulse that would be incident upon the document and an electrical impulse detection device connected to the second electrode for detecting charge given off by the piezo electric material in response to the optical pulse.

It is an advantage of this invention that by using an energy flash rapid testing may occur. It is another advantage of this invention that voltage as opposed to current is measured. It is yet another advantage that the output is dependent on the piezo material having the correct optical absorption properties in addition to being present and polarized. It is still yet another advantage of this invention that it is simple and economical.

BRIEF DESCRIPTION OF THE DRAWINGS

FIG. 6 shows a cross section of a security thread; and

FIG. 7 shows a cross section of an alternative embodiment of a security thread.

BRIEF DESCRIPTION OF THE PREFERRED EMBODIMENT

Figure 1:
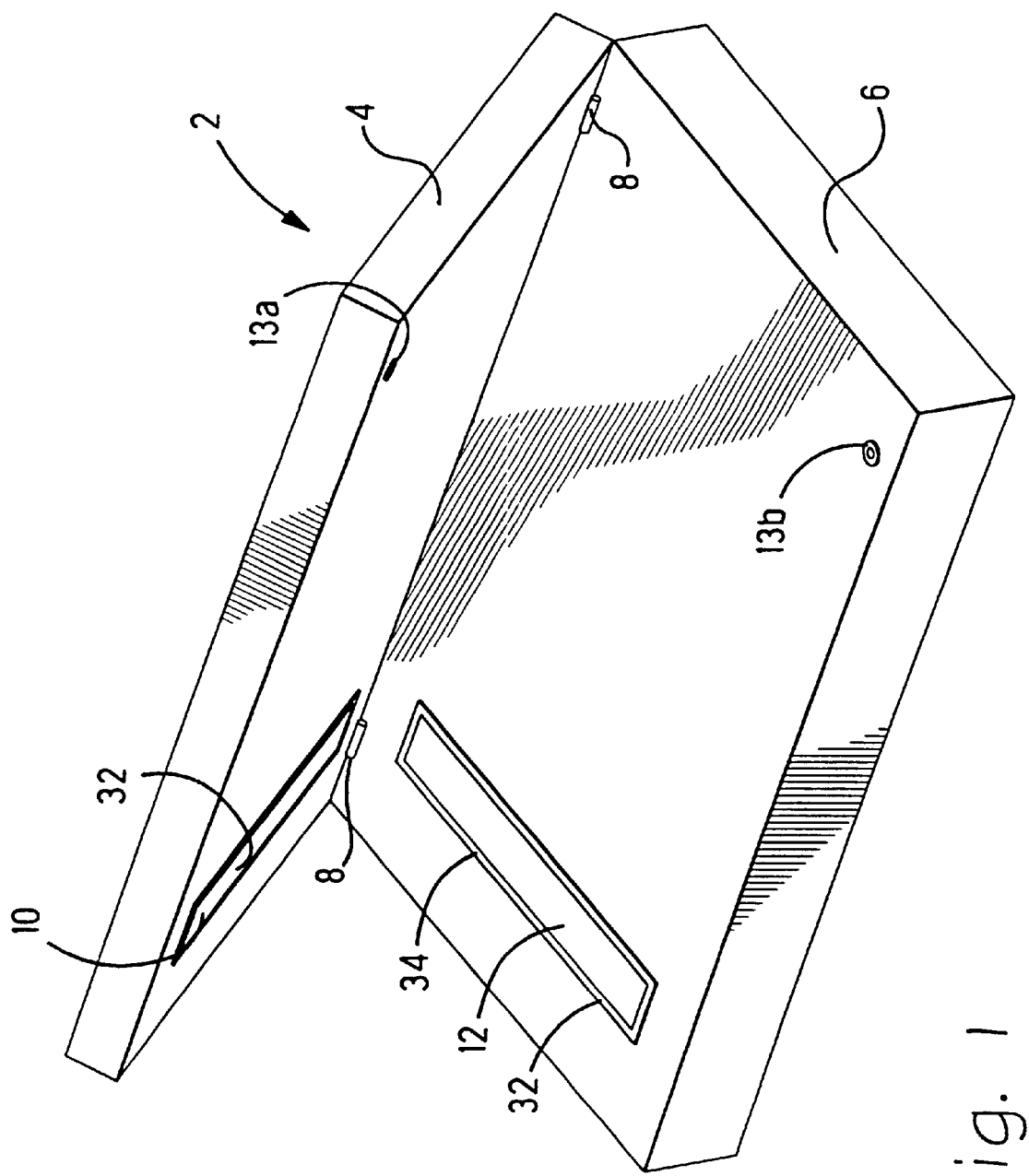
FIG. 1 is a perspective view of an apparatus according to the present invention.

First with reference to FIG. 1, a device for testing a document incorporating piezo polymer material for authenticity according to the present invention is shown generally at 2. The device 2 includes an upper housing 4 and a lower housing 6 that are joined together by hinges 8 in order to allow the housings 4,6 to be separated and a document to be inserted therebetween in a sandwich-like fashion. The upper housing 4 includes a shielded signal electrode assembly 10. Opposite thereto is located a first electrode assembly 12 that is optically transparent and electrically conductive. One example of how such a structure may be formed would have a layer of indium tin oxide (ITO) deposited upon a transparent substrate. This may be accomplished by vacuum deposition or any other convenient means. However, the conductivity of ITO depends primarily on the thickness laid down which is in conflict with the optical transmission characteristics thereof. It is also envisioned that other conductive materials may be used as desired and the transparent substrate may be either plastic or glass. Actuation of the device 2 may be controlled by a simple switch mechanism 13a,b located in the upper and lower housings 4,6 so that when the housings 4,6 are brought together, the device 2 is actuated and the test occurs.

Figure 2:
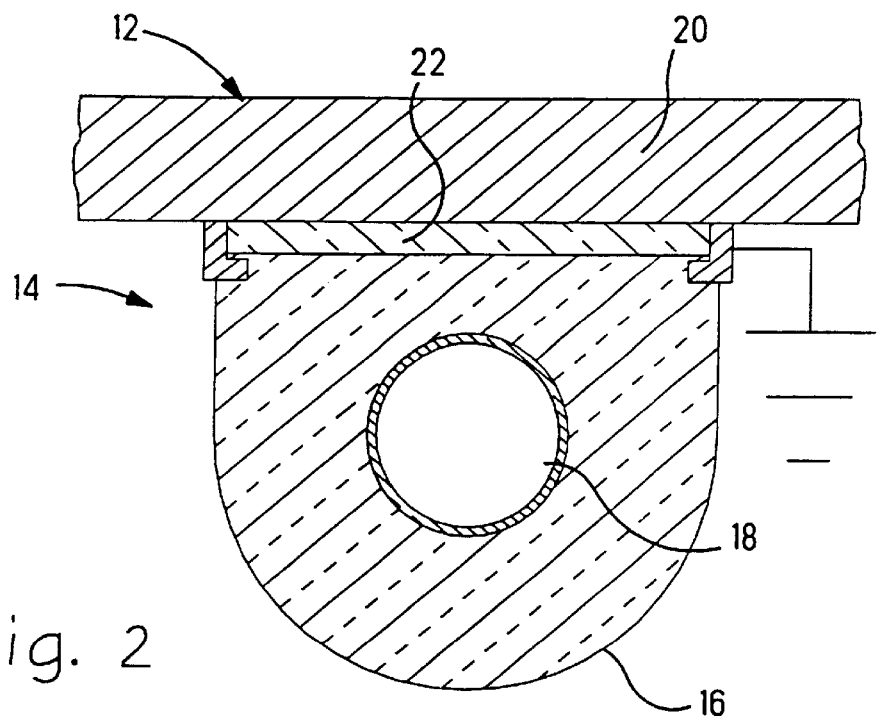
FIG. 2 is an end view of the stimulating apparatus of the device of FIG. 1.

With respect now to FIG. 2, the apparatus for exciting the piezo electric material in the document is shown generally at 14. This apparatus 14 includes a reflector 16 and a xenon flash tube 18 disposed relative to the reflector 16 and beneath a transparent substrate 20 carrying the ITO window 22 that defines the first electrode assembly 12. Note, this is an acceptable reversal of the aforedescribed structure. The flash tube 18 generates a rapid optical pulse and may advantageously contain a strong infra red content. Due to the strength of the intense flash of light, it is possible to arrive at a reasonable compromise for the thickness of the transparent electrode (ITO) to be deposited upon the substrate 20 to provide sufficient thickness for adequate conductivity in order to prevent breakthrough of the electro-magnetic impulse generated by the discharge to 18. Further, due to the close proximity with the optical source 18, it is desirable that the first electrode assembly that is transparent as described above is regarded as the ground electrode of the electrical system.

Figure 3:
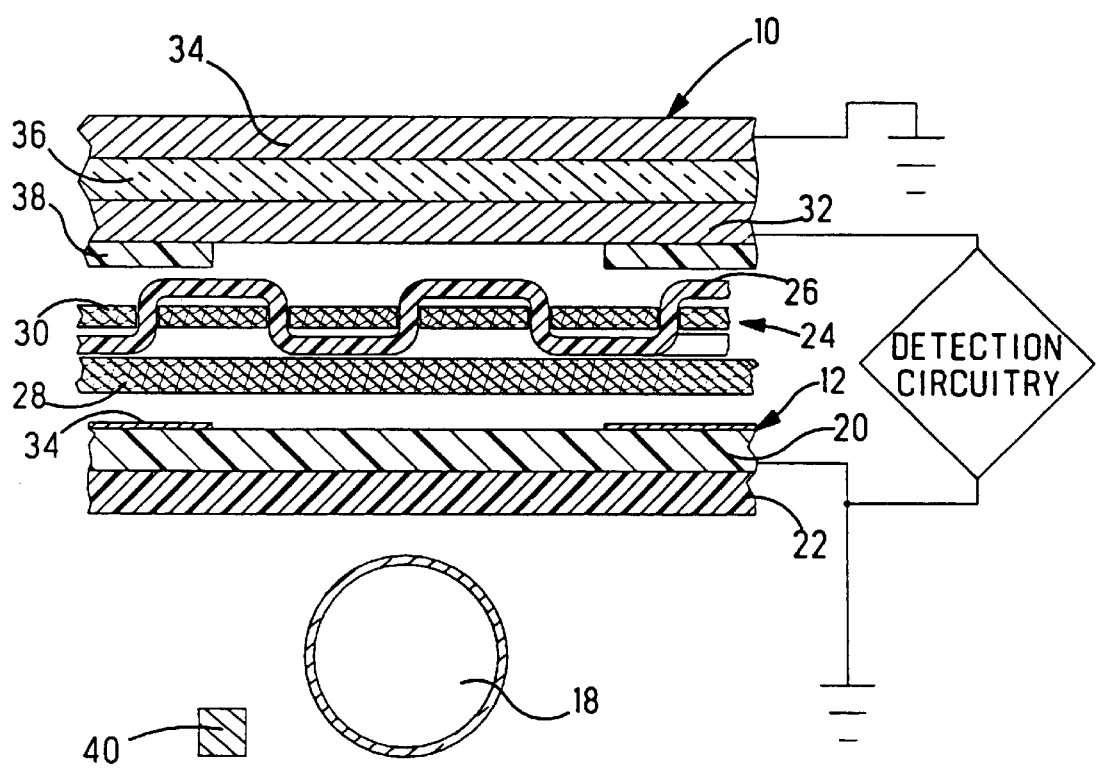
FIG. 3 is an end sectional view of part of the device of FIG. 1 showing the document to be tested disposed therein.

With reference now to FIG. 3, a cross section of the device 2 is shown positioned with a document 24 to be verified between the first and second electrode assemblies 12,10 respectively. This document is seen generally at 24 and includes a narrow "thread" of piezo electric material 26 woven within the document 24. It is common practice to incorporate into a security document a thread, which appears as a visual feature, and which may also bear additional security devices. For example, such a thread may be woven in and out of one layer of a bilaminate paper document, so that the observer sees a "broken" thread on one side, no visible thread on the reverse, but can see a solid silhouette when the note is held up to a source of light. The thread itself may comprise two layers, with additional features such as printed magnetic ink being deposited on one of the inner surfaces, which then becomes covert to the observer but is easily read by suitable authentication apparatus. Typically the document 24 will have two layers of paper 28,30. As described above, the first electrode assembly 12 includes a transparent substrate 22 carrying an ITO transparent metalization 20 thereupon, as originally described, such that radiation from the flash tube 18 must pass therethrough to reach the document 24. As shown in FIG. 1, the area to be illuminated is controlled by forming a narrow rectangular strip 32 within the lower housing 6 that is aligned with the thread 26 when the document 24 is therein and a highly electrically conductive border about the electrode, possibly by printing a pattern of conductive ink on top of the electrode 34.

Detection of the piezo electric response to the excitation by the flash tube 18 means that the transducer assembly generates a fast electrical impulse response, in order to assure of the device is sensitive only to these responses and not subject to similar impulses, which may be generated by other sources external to the device EMI/RFI), it is necessary that the signal conductor 32 be fully shielded.

The signal electrode assembly 10 is constructed using a rectangular contact area 32 that is surrounded by a grounded border and a rear ground plane 34 that covers substantially the same area as the front electrode 32 and its border. The signal electrode 10 need not be transparent but must be well shielded from electro-magnetic radiation in order to provide a clean signal as a result of the stimulation of the piezo electric thread 26 caused by the flash tube 18. One obvious construction is to use a conventional double sided printed circuit board where the substrate 36 is then disposed between the electrode and shielding 32,34.

As the gathering of the electrical signal produced by the piezo electric element 26 is accomplished by capacitive coupling and not by direct ohmic contact, it is permissible to have the signal electrode 32 and ground border insulated from the document 24. It is equally possible to utilize a layer of conductive foam 38 on the front face of the apparatus so that the document 24 under test is slightly compressed by the foam and thus lies flatter in the device 2. If this is done, it is still preferable to maintain the grounded border around the periphery of the signal electrode 32, and this may be done by using appropriate precut shapes of conductive foam that are then separated by an air gap or, if desired, by non-conductive foam. It may be advantageous to provide a thin coating of a material over each structure 10,12 where contact with the document 24 would occur to protect the structures 10,12 from wear.

As the document under test may have accumulated some electro-static charge prior to insertion into the apparatus 2, it is possible to connect the signal electrode assembly 10 to ground while the document 24 is being inserted into the apparatus 2 and then leave the signal electrode assembly 10 connected to ground until just prior to exposure to the incident light radiation. This can be accomplished using suitable analogue switching and timing devices within the control electronics.

A further enhancement may be to form the ITO-metalized electrode from a multi laminant structure of piezo electric and insulating films. By doing so a reference output may be brought to the control circuitry. Ratiometric monitoring of this output will detect when the flash unit is reaching the end of its serviceable life. Another simpler way to establish a reference output is to incorporate a photo detector 40 in close proximity to the flash unit 18.

Figure 4:
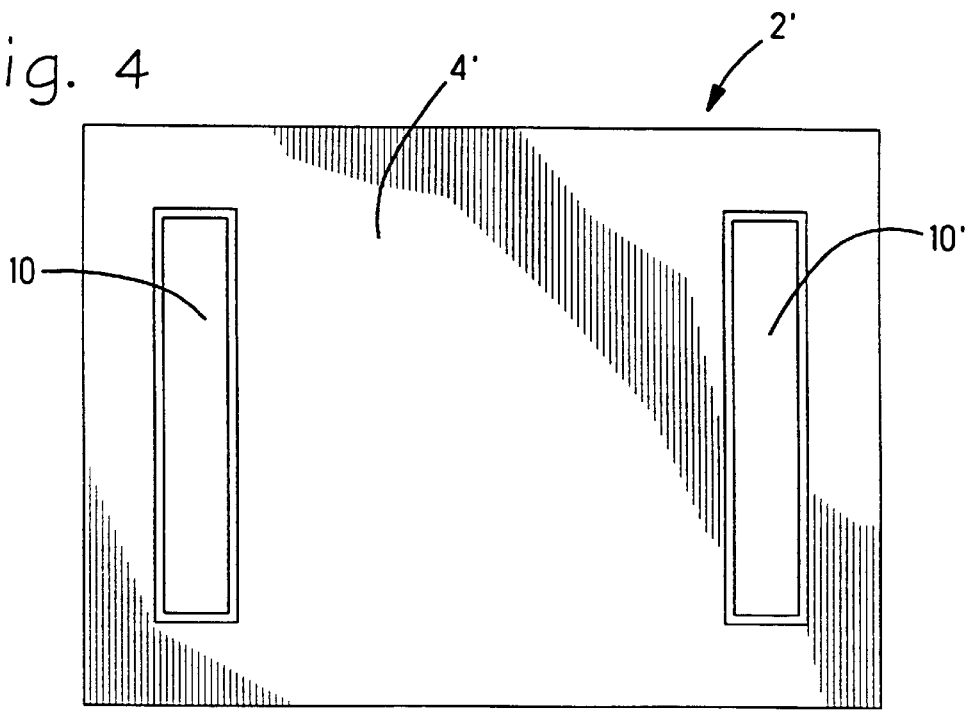
FIG. 4 shows an alternative embodiment of the signal electrode.

Yet another enhancement of the basic invention allows the apparatus to cope with document 24 where the piezo electric feature 26 of the document 24 is placed on one side of the mid-line and the orientation of the document 24 presented for verification cannot be guaranteed. With reference to FIG. 4, this would occur when the piezo electric thread 26 is disposed at one end of the document 24 and the apparatus 2' is provided with two sets of signal electrode assemblies 10,10' and corresponding first electrode assemblies 12, one at either end of the respective housings 4,6 thereby making the apparatus independent to the orientation of the document 24. This arrangement may incorporate separate light sources 18 or utilize a single light source where the output therefrom is split to provide two sources of illumination.

Furthermore, the document may be orientated in a manner that the illumination occurs from the reverse side of the document 26 from which exposure was intended. In this case, the illumination is still strong enough to result in a measurable response, but the response is of opposite polarity. Therefore, it may be desirable to incorporate into the circuitry two comparators where one is for positive signals and the other is for negative signals. The thresholds of these comparators may also be set independently from each other and it may be desirable to only accept signals that are within certain limits. By doing so it may be possible to detect attempted falsification. As a woven thread 26 as shown in the drawings has a certain active area and polarization level, the electrical response will fall within certain expected limits. A piezo electric element that is affixed directly to one surface of the document and is not woven therein will produce a response that is different from that of an authentic document.

Figure 5:
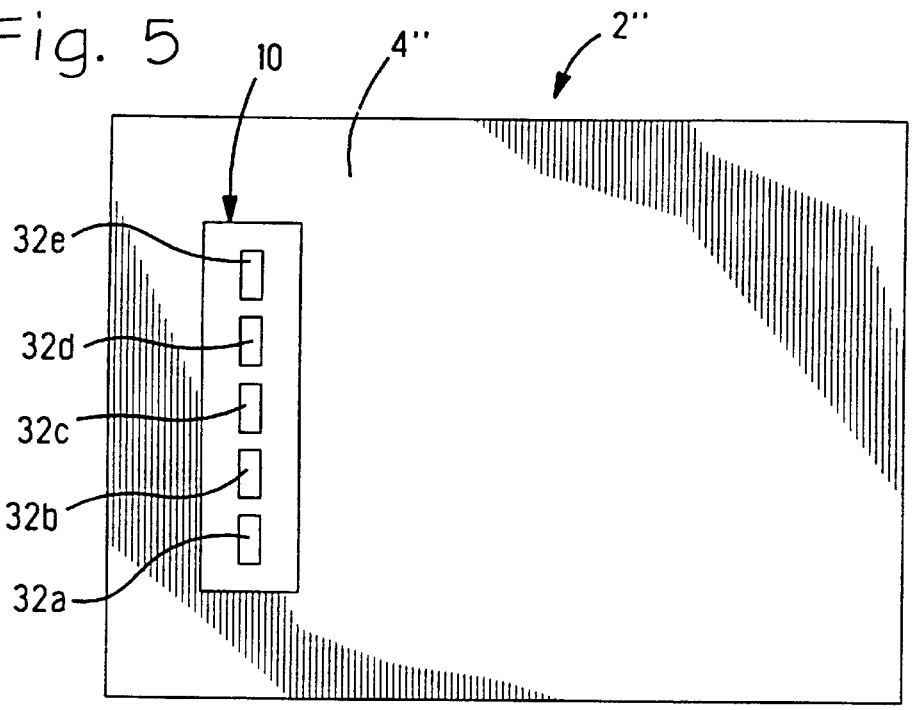
FIG. 5 shows a second alternative embodiment of the signal electrode.

With reference now to FIG. 5, a further embodiment of the apparatus 2 is shown at 2" where the single signal electrodes are split into a plurality of separate independent electrode areas 32a–e. This allows for piezo electric features 26 to be applied to a document 24 where the polarization is locally altered to provide further security. This may be accomplished by having the signal from each signal electrode 32a–e filtered directly into an independent comparator circuit in the detection circuitry so that the final output may be thought to form a digital "word" that may then be compared with a stored reference. Verification may then be in the form of a simple total count, where the number of outputs is accumulated, or alternatively by matching the resulting on/off patten with a key by more advanced techniques.

A feature of the system of the present invention is that the optical characteristics of the piezoelectric feature may also be detected play a role in determining the quantity of electrical charge generated under stimulation by the photoflash. In the case where the piezoelectric film is thinly metallized on one side only (for example, where it is desired to form one half of a bilaminar thread such as described above), then it is found that the optical absorption of the metallized surface (typically around 40 nanometres thickness of aluminum) is rather low. An example of this is shown in FIG. 6 where a thread 126 includes two layers 128,130 that are laminated together. The first layer 128 includes a film transport 132 having a deposited layer of metal 134 thereupon with pads 136 of security printing thereon. The second layer 130 also includes a film transport 138 and a metal layer 140 thereupon. The first and second layers 128,130 are joined together so that the metalized layers 134,140 sandwich the security printing 136 therebetween. By enhancing the optical absorption of this layer, the electrical output can be increased significantly.

One means of enhancing the absorption is to deposit or print an optically absorbing pigment 241, ink or paint onto the rear surface of the metallization. This does not affect the visual appearance of the thread, but means that incident radiation (from either side) is almost wholly absorbed and creates the maximum electrical response from the piezo-or pyro-electric element. This is shown in FIG. 7, where a thread 226 constructed generally according to that described above is provided; however, the second layer 230 further includes an optical absorption layer 242 deposited upon the metalization 240.

In the case where there is already a requirement to have opaque printing within the structure, then this opaque ink may equally serve as the absorber. Even where the coating is not continuous, the benefit of the presence of absorbing pigment will be felt in direct proportion to the area so covered, as in FIG. 6.

Finally, while the present invention is shown in a very simple form where each document would be independently placed between the upper and lower housing 4,6 and then sandwiched therebetween, it is fully envisioned that an automatic device may be developed for handling large quantities of documents. This device may mechanically or airfeed the documents to and from the tester and in order to speed up the verification process an intense light source may be provided that is then chopped by a shutter mechanism to provide the necessary bursts of illumination.

We claim:

1. An apparatus for testing authenticity of a document having piezo electrical material therein, comprising one substantially transparent electrode, a second shielded electrode where the document is to be placed between the first and second electrodes, a stimulating device capable of stimulating the piezo electrical material to give off an electrical charge and an electrical impulse detection device for detecting the charge given off by the piezo electric material; wherein the stimulating device is located on the side of the transparent electrode opposite the side of the piezo electric material and generates a rapid optical pulse incident upon the document after passing through the transparent electrode to simulate the piezo electric material.

2. The apparatus of claim 1 wherein the stimulating device has an optical source that has a strong infra red content.

3. The apparatus of claim 1 wherein the first electrode and the signal electrode are designed to close about the document placed therebetween with the piezo material element to be detected located between the electrodes.

4. The apparatus of claim 3, wherein the verification is accomplished by detecting the presence of a pyro electric response by the piezo electric material to illumination by detecting a charge imbalance between opposing surfaces of the piezo electric element by way of capacitively coupling the electrical response into the first and single electrodes.

5. The apparatus of claim 3, wherein the two electrodes are mechanically joined by hinge arrangement allowing the two electrodes to easily sandwich the document therebetween.

6. The apparatus of claim 4, where the signal electrode assembly comprises in part a thickness of electrically conductive foam.

7. The apparatus of claim 6, where the signal electrode comprises separate sections of conductive foam spaced apart by an air gap or insulating foam such that the conductive foam sections may be utilized as a signal electrode and as a ground shield.

8. The apparatus of claim 1, where the first electrode is transparent and includes a transparent substrate having a deposit of transparent metalization thereupon.

9. The apparatus of claim 1, where two detection areas each comprising a first electrode and a signal electrode assembly are provided such that the document to be tested may be received within the apparatus in at least two orientations.

10. The apparatus of claim 1, where the electrical impulse detection device includes a comparator for distinguishing when the response exceeds a given threshold value.

11. The apparatus of claim 10, where the electrical impulse detection device includes separate circuitry directed to positive and negative responses.

12. The apparatus of claim 10, where the comparator circuitry include upper and lower detection thresholds.

13. The apparatus of claim 1, where the signal electrode comprises a plurality of independent signal contact elements, physically disposed therein to allow detection of differing piezo electric response as a result of illumination by the optical source.

14. A security system for detecting authentic or falsified documents comprising a document having a piezo-electric material associated therewith a testing device comprising a first electrode, a second shielded electrode, detection circuitry connected to said first and second electrodes, positioning means so that the piezo-electric material is positioned between said electrodes and excitement apparatus to stimulate the piezo-electrical material;

wherein the first electrode is transparent and the excitement apparatus includes an optical source imposed therebehind for stimulating the piezo-electric material by producing a rapid optical pulse that passes through the transparent electrode before being incident on the piezo-electric material.

15. The system of claim 14 wherein a piezo-electric thread is incorporated into the document.

16. The system of claim 15, wherein the piezo-electric thread includes a lamination of two film transports with a metalization layer upon at least one of the transports and an absorption layer against the metalization layer and laminated between the transport layers.

17. The system of claim 16, wherein security printing is included between the transports.

18. The system of claim 16, wherein opaque security printing acts as the absorption layer.

* * * * *